United States Patent
Carkin

(10) Patent No.: US 11,857,816 B2
(45) Date of Patent: Jan. 2, 2024

(54) FALL PREVENTION SAFETY INTERLOCK

(71) Applicant: Down Safely LLC, Sutton, MA (US)

(72) Inventor: Eric William Carkin, Beverly, MA (US)

(73) Assignee: Down Safely LLC, Sutton, MA (US)

(*) Notice: Subject to any disclaimer, the term of this patent is extended or adjusted under 35 U.S.C. 154(b) by 287 days.

(21) Appl. No.: 17/335,614

(22) Filed: Jun. 1, 2021

(65) Prior Publication Data
US 2022/0379146 A1 Dec. 1, 2022

(51) Int. Cl.
*H03K 5/24* (2006.01)
*A62B 35/00* (2006.01)
*G05B 9/02* (2006.01)
*B66F 17/00* (2006.01)

(52) U.S. Cl.
CPC ...... *A62B 35/0037* (2013.01); *A62B 35/0018* (2013.01); *G05B 9/02* (2013.01); *H03K 5/24* (2013.01); *B66F 17/006* (2013.01)

(58) Field of Classification Search
CPC ............ A62B 35/0025; A62B 35/0018; A62B 35/0037; H03K 5/24; G05B 9/02; B66F 17/006
See application file for complete search history.

(56) References Cited

U.S. PATENT DOCUMENTS

| | | | |
|---|---|---|---|
| 6,265,983 B1* | 7/2001 | Baillargeon | B66F 11/044 340/687 |
| 10,568,393 B2* | 2/2020 | Moran | A44B 11/253 |
| 11,042,129 B2* | 6/2021 | Moran | B66F 11/042 |
| 2010/0231402 A1* | 9/2010 | Flynt | G08B 19/00 340/679 |
| 2011/0090079 A1* | 4/2011 | Morino | A62B 35/0075 340/532 |
| 2016/0107007 A1* | 4/2016 | Pollard | A62B 35/0075 182/3 |

* cited by examiner

*Primary Examiner* — Quan Tra
(74) *Attorney, Agent, or Firm* — Intrinsic Law Corp.

(57) ABSTRACT

A safety interlock system includes a safety harness comprising a plurality of buckles to secure the harness to a user and a safety attachment ring. A fall-arrest belt clip is configured to be releasably attached to the safety attachment ring, the fall-arrest belt clip attached to a fall-arrest tether of a machine. The system further includes a safety interlock means for disabling an operation of the machine when the fall-arrest clip is detached from the safety attachment ring, the machine coupled to the fall-arrest tether.

26 Claims, 21 Drawing Sheets

FALL PREVENTION SAFETY INTERLOCK

TECHNICAL FIELD

This application relates generally to safety interlock systems.

BACKGROUND

Fall-arrest protection devices are available for machines used in warehouses, construction, and maintenance environments that raise or lift an individual to perform a task. Typically, these devices include a safety harness worn by the individual. The safety harness is secured to a fall-arrest tether, which is attached to the machine. Though these devices work well when used, individuals can forget or neglect to use them, which can cause serious injury or death.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages, and novel features of the disclosure will be set forth in the following detailed description of the disclosure when considered in conjunction with the drawings, which are intended to illustrate, not limit, the invention.

An aspect of the invention is directed to a safety interlock system comprising: a safety harness that comprises a plurality of buckles to secure the harness to a user; and a safety attachment ring. The safety interlock system further comprises a harness interlock circuit comprising a harness coil attached to the safety attachment ring; a fall-arrest belt clip configured to be releasably attached to the safety attachment ring, the fall-arrest belt clip attached to a fall-arrest tether; and an equipment safety interlock circuit that comprises a fall-arrest coil disposed on or in the fall-arrest belt clip; a relay controller configured to generate a safety signal when an increase in a current flowing through the fall-arrest coil is greater than a minimum value; and a safety interlock relay having a default open state and a closed state, the safety interlock relay configured to transition from the default open state to the closed state only in response to the safety signal. When a load is present across the harness coil, the current flowing through the fall-arrest coil when the fall-arrest belt clip is attached to the safety attachment ring is greater than the current flowing through the fall-arrest coil when the fall-arrest belt clip is detached from the safety attachment ring, and a difference between (a) the current flowing through the fall-arrest coil when the fall-arrest belt clip is attached to the safety attachment ring and (b) the current flowing through the fall-arrest coil when the fall-arrest belt clip is detached from the safety attachment ring is greater than the minimum value.

In one or more embodiments, the harness interlock circuit further comprises: a battery; and an oscillator electrically coupled to the battery, the oscillator configured to produce an oscillator signal that drives the harness coil. In one or more embodiments, the system further comprises a power circuit electrically coupled to the oscillator, the power circuit comprising the battery and a plurality of mechanical switches electrically coupled in series with each other, each mechanical switch disposed in a respective buckle and having an open state when the respective buckle is disconnected and a closed state when the respective buckle is connected. In one or more embodiments, the battery provides power to the oscillator only when all of the mechanical switches are in the closed state.

In one or more embodiments, the equipment safety interlock circuit further comprises a current sensor having an input electrically coupled to the fall-arrest coil and an output electrically coupled to the relay controller. In one or more embodiments, the equipment safety interlock circuit further comprises an amplifier having an input electrically coupled to the fall-arrest coil and an output electrically coupled to the relay controller. In one or more embodiments, the amplifier includes a pre-comparator having an input electrically coupled to the fall-arrest coil; a filter having an input electrically coupled to an output of the pre-comparator; and a post-comparator having an input electrically coupled to the output of the filter and an output electrically coupled to the relay controller. In one or more embodiments, the amplifier is configured to convert the current flowing through the fall-arrest coil into an ON signal when the increase in the current flowing through the fall-arrest coil is greater than the minimum value, and the relay controller is configured to generate the safety signal in response to the ON signal.

In one or more embodiments, the relay controller comprises a switch having a default open state and a closed state, the relay controller configured to transition the switch to the closed state only in response to the ON signal. In one or more embodiments, the system further comprises a back-up power supply power source to power the harness interlock circuit when the battery is depleted. In one or more embodiments, the buckles are configured to secure the harness to the legs and the chest of the user. In one or more embodiments, the system further comprises a fall-arrest vest that comprises the safety harness.

In one or more embodiments, the equipment safety interlock circuit further comprises a tunable oscillator configured to produce an oscillator signal that drives the fall-arrest coil. In one or more embodiments, the tunable oscillator is configured to drive the fall-arrest coil at a resonance frequency of the coupled harness interlock circuit. In one or more embodiments, the equipment safety interlock circuit further comprises a current sensor having an input electrically coupled to the fall-arrest coil and an output electrically coupled to the relay controller.

In one or more embodiments, the harness interlock circuit further comprises a plurality of vest control load resistors that are electrically coupled in parallel with each other and that are electrically coupled to the harness coil. In one or more embodiments, the harness interlock circuit further comprises a plurality of switches, each switch electrically coupled to a respective vest control load resistor to independently vary a load across the harness coil to alter a reflected impedance from and the current flowing through the fall-arrest coil.

In one or more embodiments, the system further comprises a harness coil frame having a slot to receive the safety attachment ring, the harness coil attached to the harness coil frame. In one or more embodiments, the harness coil is wrapped around a coil insert and the harness coil frame includes a spool housing configured to receive the coil insert.

Another aspect of the invention is directed to a safety interlock system comprising: a safety harness that comprises a plurality of buckles to secure the harness to a user; and a safety attachment ring. The safety interlock system further comprises a harness interlock circuit disposed on or in the vest, the harness circuit comprising: a light-sensor ring comprising a plurality of light emitters and a plurality of light sensors, the light sensors configured to receive light emitted by the light emitters; a harness controller electrically coupled to an output of the light-sensor ring; and a harness antenna electrically coupled to the harness controller. The safety interlock system further comprises a fall-arrest belt clip configured to be releasably attached to the safety attachment ring, the fall-arrest belt clip attached to a fall-arrest tether; and an equipment safety interlock circuit comprising: an equipment controller; an equipment safety antenna electrically coupled to the equipment controller; a relay controller electrically coupled to an output of the equipment controller, the relay controller configured to generate a safety signal in response to an output signal from the equipment controller; and a safety interlock relay having a default open state and a closed state, the safety interlock relay configured to transition from the default open state to the closed state only in response to the output signal. When the fall-arrest belt clip is detached from the safety attachment ring, each light sensor receives the light emitted by at least one of the light emitters to place the light-sensor ring in a first state. When the fall-arrest belt clip is attached to the safety attachment ring, the fall-arrest belt clip blocks at least one of the light sensors from receiving the light from at least one of the light emitters to place the light-sensor ring in a second state. The harness controller is configured to broadcast a second state signal, via the harness antenna, when the light-sensor ring is in the second state. The equipment controller is configured to produce the output signal only in response to receiving the second state signal via the equipment safety antenna.

In one or more embodiments, the harness controller is configured to broadcast a first state signal, via the harness antenna, when the light-sensor ring is in the first state. In one or more embodiments, the light emitters are configured to emit infrared light. In one or more embodiments, the harness interlock circuit further comprises a battery that is electrically coupled to the light-sensor ring and the harness controller.

In one or more embodiments, the harness interlock circuit further comprises a plurality of mechanical switches electrically coupled in series with each other, each mechanical switch disposed in a respective buckle and having an open state when the respective buckle is disconnected and a closed state when the respective buckle is connected, and the mechanical switches are electrically coupled to the harness controller. In one or more embodiments, the harness controller is configured to broadcast the second state signal, via the harness antenna, when the light-sensor ring is in the second state and all of the mechanical switches are in the closed state. In one or more embodiments, the harness controller is configured to broadcast a first state signal, via the harness antenna, when the light-sensor ring is in the first state and/or at least one of the mechanical switches is in the open state.

Yet another aspect of the invention is directed to a safety interlock system comprising: a safety harness that comprises a plurality of buckles to secure the harness to a user; and a safety attachment ring. The safety interlock system further comprises a fall-arrest belt clip configured to be releasably attached to the safety attachment ring, the fall-arrest belt clip attached to a fall-arrest tether of a machine; and a safety interlock means for disabling an operation of the machine when the fall-arrest clip is detached from the safety attachment ring, the machine coupled to the fall-arrest tether. In one or more embodiments, the safety interlock means is configured to enable an operation of the machine only when the fall-arrest clip is attached to the safety attachment ring.

BRIEF DESCRIPTION OF THE DRAWINGS

For a fuller understanding of the nature and advantages of the present concepts, reference is made to the detailed description of preferred embodiments and the accompanying drawings.

DETAILED DESCRIPTION

A fall-prevention safety interlock system includes a harness interlock circuit and a safety interlock circuit. The harness interlock circuit includes a means to communicate with the safety interlock circuit to confirm that one or more safety conditions have been met. The safety interlock circuit is electrically coupled to a machine to enable and/or disable the machine based on whether the safety conditions have been met. One safety condition can include whether a fall-arrest clip at the end of a fall-arrest tether of the machine is attached to a safety attachment ring on a safety harness or safety garment worn by an individual. Another safety condition can include whether all of the buckles on the safety harness or garment are attached.

Figure 1:
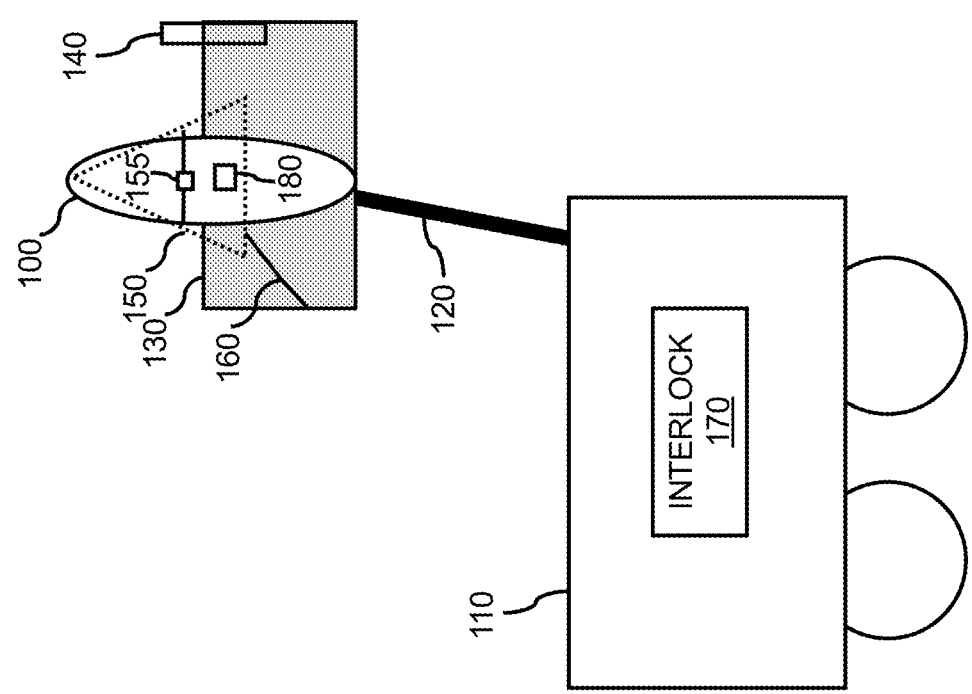
FIG. 1 is a block diagram of an environment in which the safety interlock system can be disposed.

FIG. 1 is a block diagram of a person 100 lifted by an example machine 110 to illustrate the environment in which the safety interlock system can be disposed. The example machine 110 is illustrated as a bucket truck or cherry picker. In other embodiments, the example machine 110 can be a scissor lift, an aerial lift, a boom lift, or another lift or machine. In another embodiment, the machine 110 can be a power-suspended platform for performing maintenance on and/or washing windows of a skyscraper. The machine 110 can be used in a warehouse, on a construction site, at a maintenance or repair site (e.g., while repairing telephone or electrical lines), and/or in other environments.

The machine 110 includes an arm 120 that can raise and lower a bucket 130 to position the person 100 to perform a task. The arm 120 can be controlled via controls 140 on the machine 110 such as in the bucket 120. The controls 140 can communicate with the machine 110 through a wired circuit that extends through the bucket 130 and arm 120.

Figure 2:
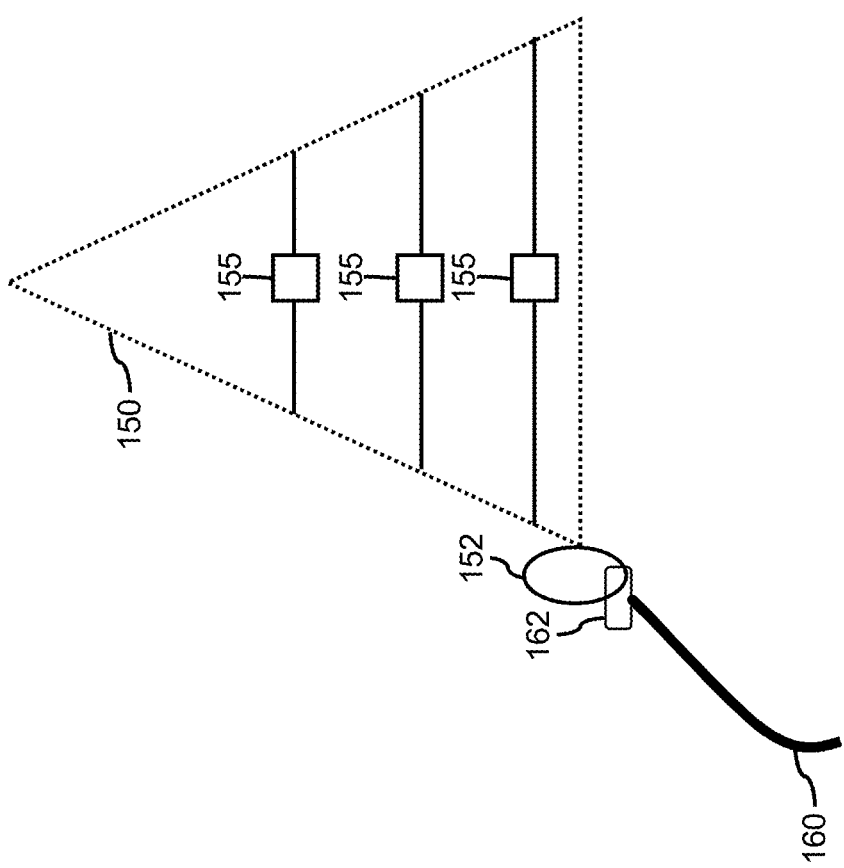
FIG. 2 is an enlarged view of the safety harness and fall-arrest tether illustrated in FIG. 1.

When the person 100 is in the bucket 130, the person 100 typically wears a safety harness 150. A fall-arrest tether 160 is attached to the safety harness 150 and the bucket 130 to prevent the person 100 from falling while performing a task in the bucket 130. The safety harness 150 includes a safety attachment ring 152 that can releasably receive a fall-arrest clip 162 at the end of the fall-arrest tether 160, as illustrated in FIG. 2. The attachment ring 152 can comprise a D-ring or another ring. The fall-arrest clip 162 can comprise a carabiner or another clip. In an alternative embodiment, the fall-arrest clip 162 can be attached to the safety harness 150 and the attachment ring 152 can be attached to the fall-arrest tether 160. The safety harness 150 can be partially or fully integrated into a safety garment, such as a vest, a jacket, overalls, or another garment.

The machine 110 and safety harness 150 include interlock circuits 170, 180, respectively, that can require the safety harness 150 to be attached to the fall-arrest tether 160 in order for the machine 110 to operate (e.g., for the controls 140 to work). In some embodiments, the safety harness 150 can include circuitry that can require that all buckles 155 of the safety harness are secured in order for the machine 110 to operate. The interlocks circuits 170, 180 can be separate from or integrated with other interlock circuits in the machine 110. For example, the machine 110 can include an interlock circuit that requires a physical or digital key and/or the depression of a foot pedal (e.g., a dead-man pedal) to operate the machine 110.

Figure 3:
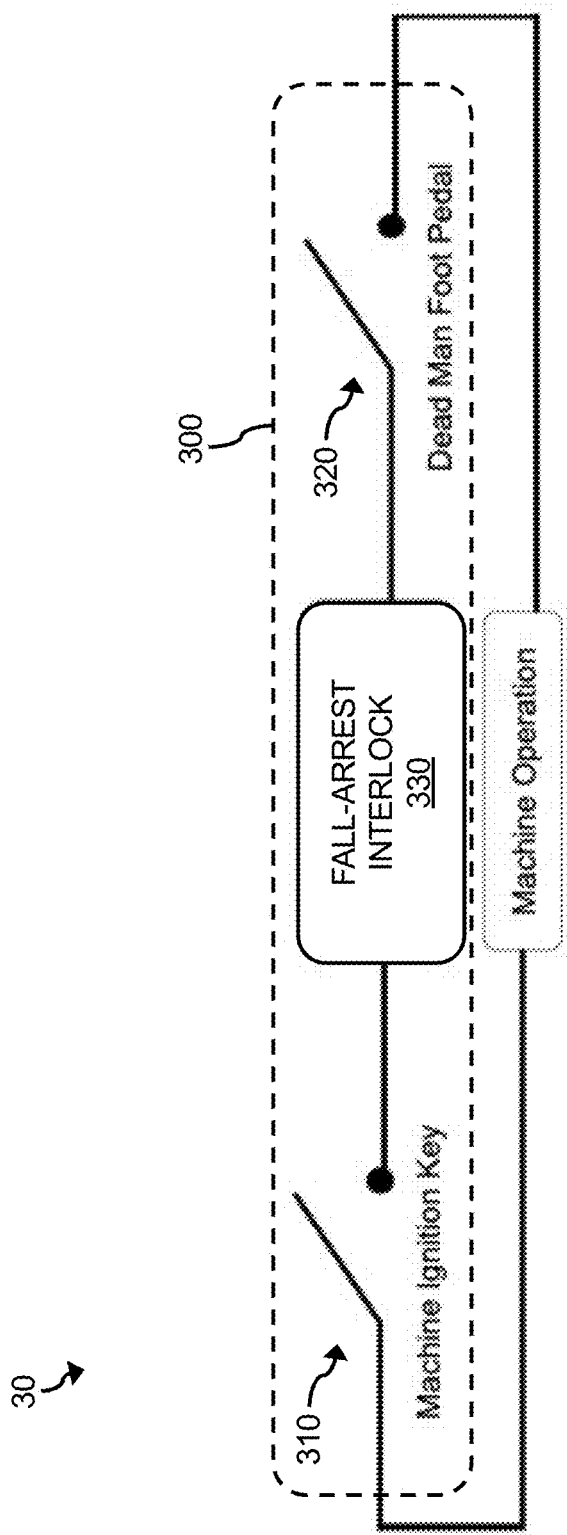
FIG. 3 is a schematic diagram of a safety interlock circuit according to an embodiment.

An example of a schematic safety interlock circuit 30 in the machine 110 is illustrated in FIG. 3. The interlock circuit 30 includes a safety interlock chain 300 that includes multiple safety interlocks. For example, the safety interlock chain 300 includes a machine ignition key interlock 310, a dead man foot pedal interlock 320, and a fall-arrest interlock circuit 330. All interlocks 310, 320, 330 need to be satisfied (e.g., in the closed state) in order for the machine 110 operate. In some embodiments, interlock 310 and/or 320 is/are optional. Safety interlock circuit 30 can be the same as interlock circuit 170.

Figure 4:
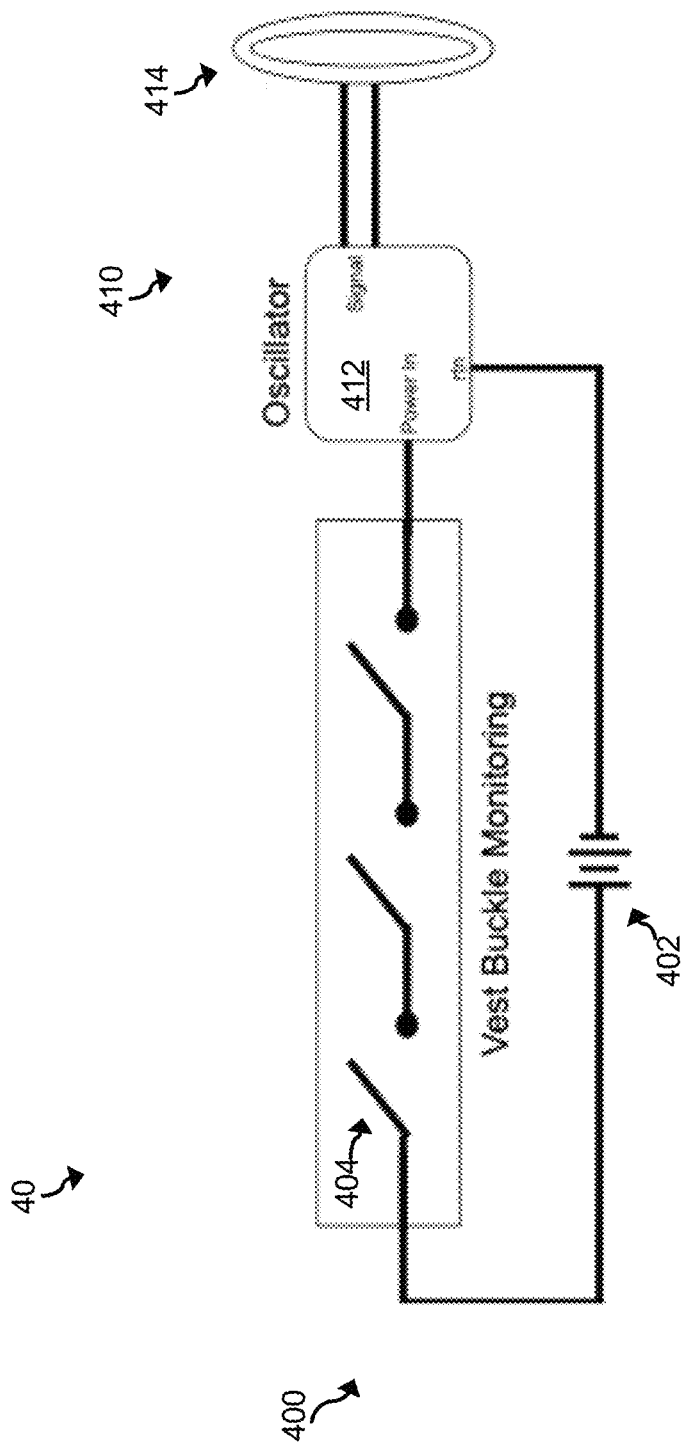
FIG. 4 is a schematic diagram of a harness interlock circuit according to an embodiment.

FIG. 4 is a schematic diagram of a harness interlock circuit 40, according to an embodiment, that can be incorporated and/or integrated into the safety harness 150. The harness interlock circuit 40 includes a power circuit 400 and a transmit circuit 410. The power circuit 400 includes a battery 402 and a plurality of optional mechanical switches 404. The battery 402 can comprise a 9V battery or another battery, which can be replaced or recharged when depleted. The transmit circuit 410 includes an oscillator 412 and a harness coil 414. The harness interlock circuit 40 can be the same as interlock circuit 180.

The mechanical switches 404 are electrically connected in series with each other. Each mechanical switch 404 is disposed in a corresponding buckle 155 of the safety harness 150. The mechanical switches 404 are in the open state when the buckles 155 are disconnected and are in the closed state when the buckles 155 are connected or secured. The mechanical switches 404 can have a default state as the open state. When one or more of the mechanical switches 404 is/are in the open state, the power circuit 400 is open and power from the battery 402 is not provided to the oscillator 412. When all of the mechanical switches 404 are in the closed state, the power circuit 400 is closed and power from the battery 402 is provided to the oscillator 412. The optional mechanical switches 404 can be omitted from the harness interlock circuit 40 in some embodiments.

Figure 5:
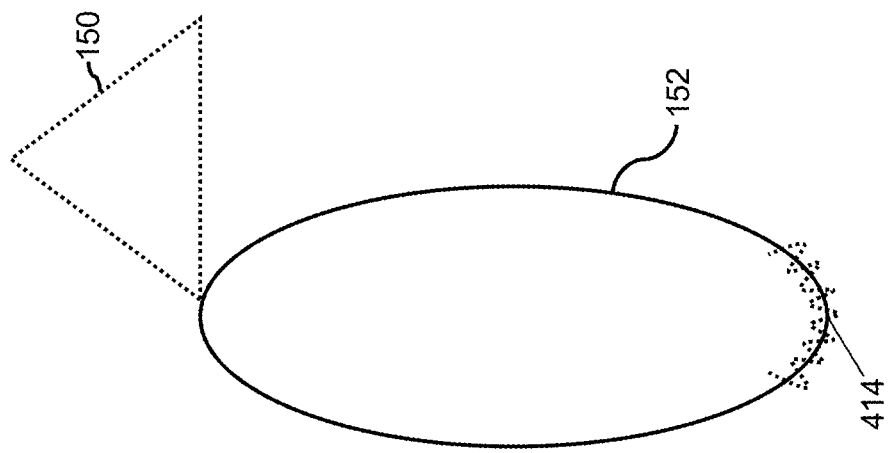
FIG. 5 is a block diagram of a harness coil on a safety attachment ring according to an embodiment.

When power is provided to the oscillator 412, the oscillator 412 produces an oscillating signal that drives the harness coil 414. The harness coil 414 includes one or more loops of wire that produces an oscillating electromagnetic signal when driven by the oscillator 412. The loop(s) of wire in the harness coil 414 can be disposed on, in, and/or around the attachment D-ring 152, for example as illustrated in FIG. 5. In FIG. 5, the harness coil 414 and attachment D-ring 152 are illustrated in an enlarged view while a smaller illustration of the safety harness 150 is included for reference.

In some embodiments, a voltage sensor can be electrically coupled to the battery 402 to monitor the charge of the battery 402. A battery-life indicator, such as a light (e.g., a light-emitting diode (LED)), can be placed on the safety harness 150 to indicate the energy state of the battery 402. The battery-life indicator can be electrically coupled to the voltage sensor. In some embodiments, a back-up power supply can be available on the machine 110 (e.g., in the bucket 130) in case the battery 402 becomes depleted while a worker is in the bucket 130 and elevated above ground level.

Figure 6:
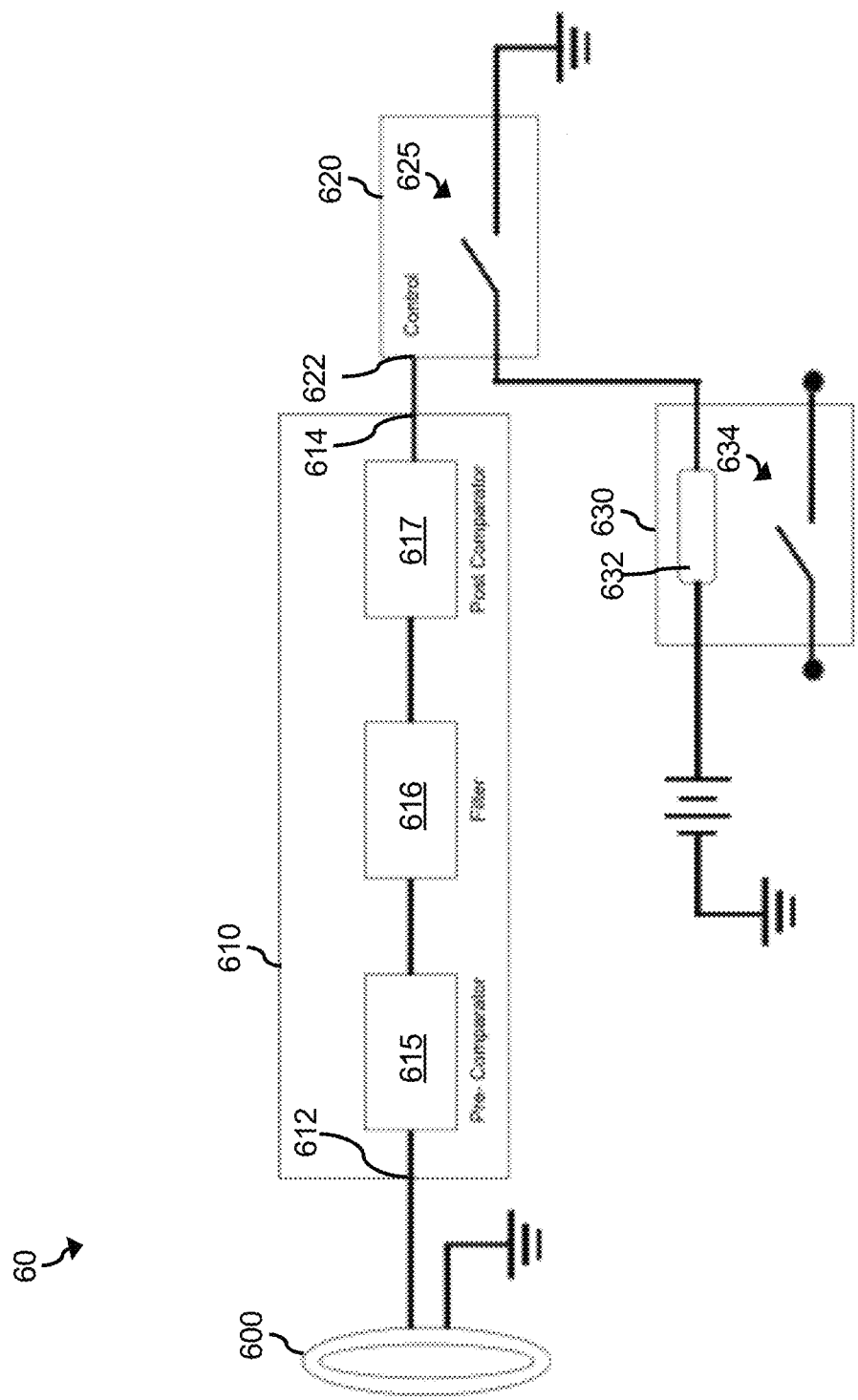
FIG. 6 is a schematic diagram of an equipment safety interlock circuit according to an embodiment.

FIG. 6 is a schematic diagram of an equipment safety interlock circuit 60, according to an embodiment, that can be incorporated and/or integrated into the machine 110. The equipment safety interlock circuit 60 includes a fall-arrest equipment monitoring coil 600, an amplifier 610, a relay controller 620, and a safety interlock relay 630. The equipment safety interlock circuit 60 can be the same as or can be included in interlock circuit 170. For example, the safety interlock circuit 60 can be the same as fall-arrest interlock circuit 330.

Figure 7:
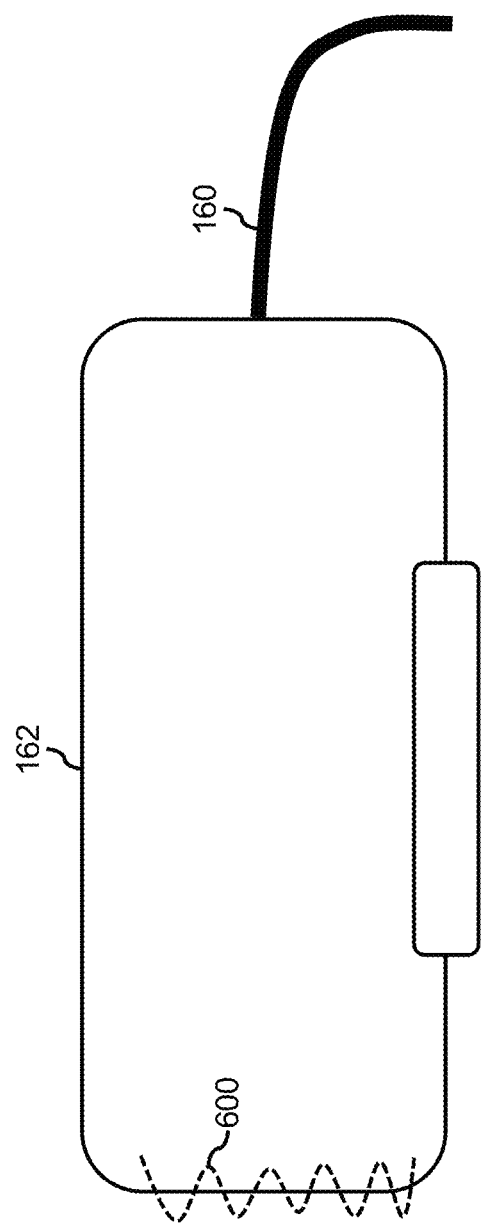
FIG. 7 is a block diagram of a fall-arrest coil on a fall-arrest clip according to an embodiment.

The fall-arrest equipment monitoring coil 600 includes one or more loops of wire through which an oscillating voltage (e.g., an oscillating voltage greater than or equal to a predetermined value) is induced by the oscillating electromagnetic signal produced by the harness coil 414 when the fall-arrest equipment monitoring coil 600 is within range (e.g., within a predetermined distance) of the harness coil 414. When the fall-arrest equipment monitoring coil 600 is out of range (e.g., greater than a predetermined distance) of the harness coil 414, a voltage is not induced in the fall-arrest equipment monitoring coil 600 or the induced voltage is lower than a predetermined value. The loop(s) of wire in the fall-arrest equipment monitoring coil 600 can be disposed on, in, and/or around the fall-arrest clip 162, for example as illustrated in FIG. 7.

The amplifier 610 has an input 612 that is electrically coupled to the fall-arrest equipment monitoring coil 600 and an output 614 that is electrically coupled to an input 622 of the relay controller 620. The amplifier 610 can amplify the voltage signal induced in the fall-arrest equipment monitoring coil 600 and can produce an ON signal when the voltage across or the current in the fall-arrest equipment monitoring coil 600 is greater than a predetermined minimum value, which can indicate that the fall-arrest equipment monitoring coil 600 is within range of the harness coil 414. In addition, the amplifier 610 can produce an OFF signal when the voltage across or the current in the fall-arrest equipment monitoring coil 600 is lower than the predetermined minimum value, which can indicate that the fall-arrest equipment monitoring coil 600 is out of range of the harness coil 414. Since the range of the harness coil 414 is limited, the ON signal can indicate that the fall-arrest clip 162 is attached to the attachment ring 152. In an alternative embodiment, the amplifier 610 can be replaced with a voltage sensor and/or a current sensor.

The amplifier 610 can include a pre-comparator 615, a filter 616, and a post-comparator 617. The input of the pre-comparator 615 can be electrically coupled to the fall-arrest equipment monitoring coil 600. The output of the pre-comparator 615 can be electrically coupled to the input of the filter 616. The output of the filter 616 can be electrically coupled to the input of the post-comparator 617. The output of the post-comparator 617 can be electrically coupled to the input 622 of the relay controller 620. Due to the potentially-small AC signal amplitude induced by the harness coil 414 when the fall-arrest equipment monitoring coil 600 is in range, the signal is amplified and rectified. The pre-comparator 615 produces a square wave signal output, much larger in amplitude (e.g., potentially on the order of ×1000) and in sync with the positive peaks of the AC signal induced in the fall-arrest equipment monitoring coil 600. This larger signal is elevated above the noise floor, and can be "smoothed" out by the filter circuit 616. The filter circuit 616 produces a more even amplitude signal, which will be entirely above a certain threshold. Post comparator 617 has a reference voltage below this threshold, and thus will produce a constant DC signal at a desired amplitude in order to drive relay controller 620.

The relay controller 620 is configured to generate a safety signal when the voltage across and/or current in the fall-arrest equipment monitoring coil 600 is greater than a predetermined minimum value. For example, the relay controller 620 can produce the safety signal in response to receiving the ON signal from the amplifier 610. The ON signal can cause a switch 625 in the relay controller 620 to transition from a default open state to a closed state to produce the safety signal. In some embodiments, the switch 625 can drive a relay coil 632 to magnetically actuate a relay switch 634 in the safety interlock relay 630.

The safety interlock relay 630 has a default open state and a closed state. In the open state, the safety interlock relay 630 can prevent the machine 110 from receiving power (e.g., from a battery in the machine 110) to operate, which can prevent the controls 140 from functioning. In the closed state, the machine 110 and/or controls 140 can receive power to operate or function. The safety interlock relay 630 can transition from the default open state to the closed state only in response to the safety signal from the relay controller 620 which can drive the relay coil 632 to close the relay switch 634. The safety interlock relay 630 can include or can be electrically coupled to other safety interlocks in the safety interlock chain 300 such as the machine ignition key interlock 310 and/or the dead man foot pedal interlock 320. For example, the safety interlock circuit 60 or the safety interlock relay 630 can be the same as fall-arrest interlock circuit 330.

Figure 8:
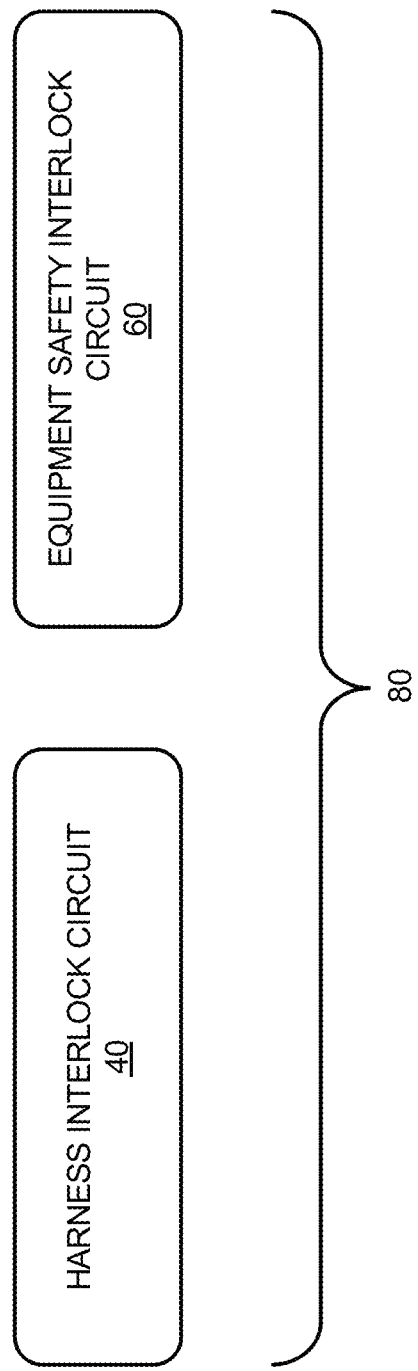
FIG. 8 is a block diagram of a safety interlock system according to an embodiment.

Thus, harness interlock circuit 40 and equipment safety interlock circuit 60 can function together as a safety interlock system 80, as illustrated in FIG. 8.

Figure 9:
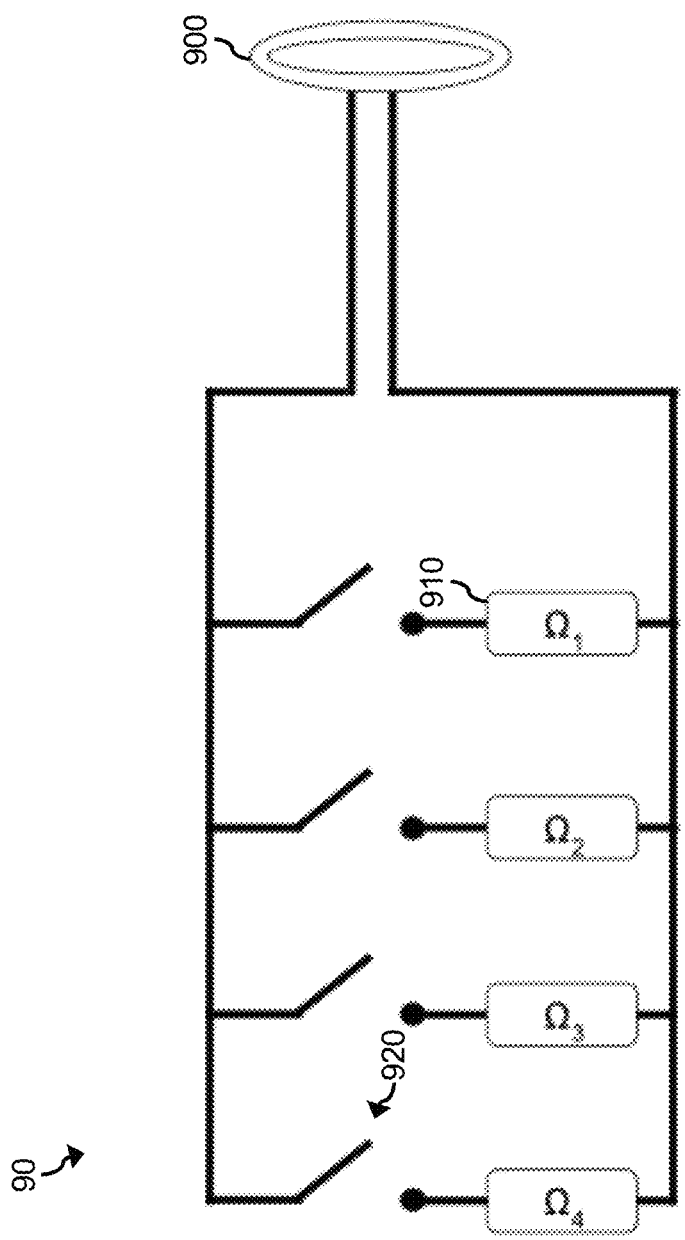
FIG. 9 is a schematic diagram of a harness interlock circuit according to an alternative embodiment.

FIG. 9 is a schematic diagram of a harness interlock circuit 90, according to an alternative embodiment, that can be incorporated and/or integrated into the safety harness 150. The harness interlock circuit 90 includes a harness coil 900, a plurality of vest control load resistors 910, and a plurality of switches 920. The harness interlock circuit 90 can be the same as interlock circuit 180.

Figure 10:
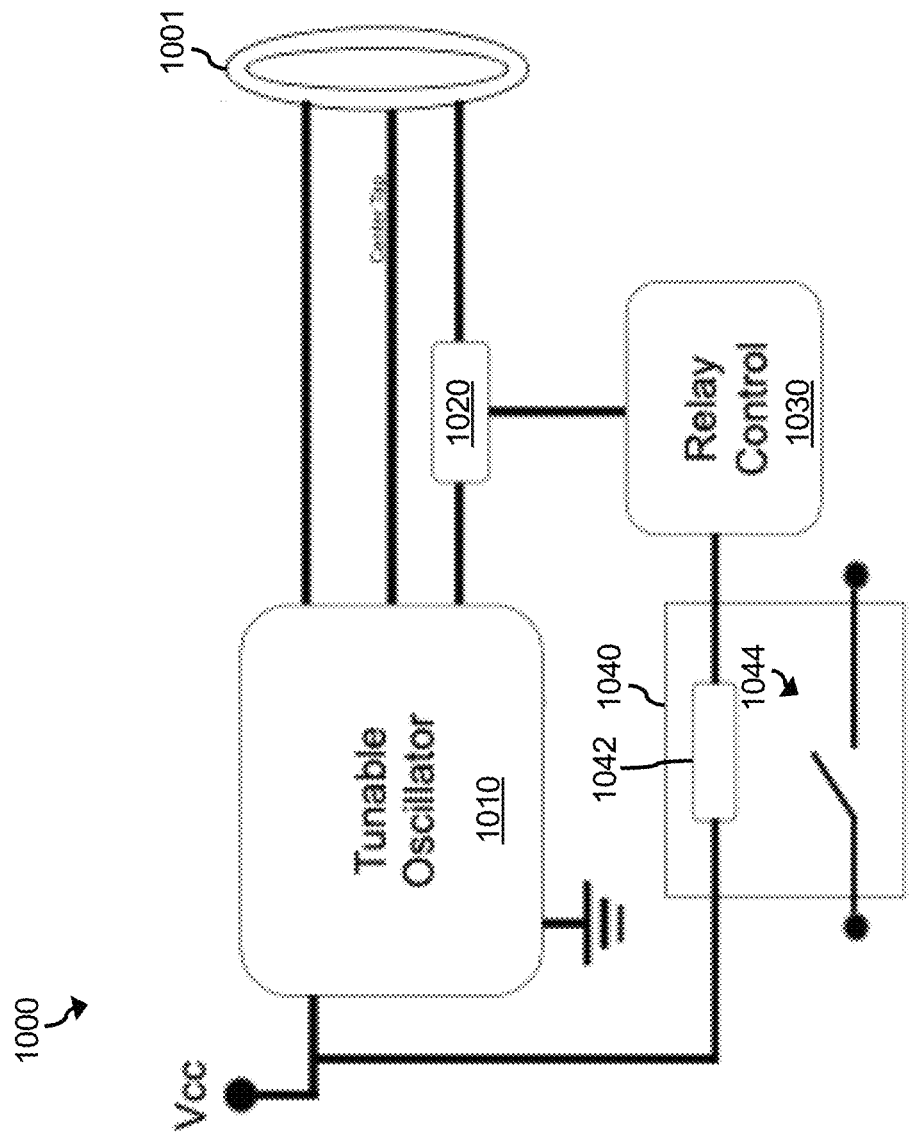
FIG. 10 is a schematic diagram of an equipment safety interlock circuit according to an alternative embodiment.

FIG. 10 is a schematic diagram of an equipment safety interlock circuit 1000, according to an alternative embodiment, that can be incorporated and/or integrated into the machine 110. The equipment safety interlock circuit 1000 includes a fall-arrest equipment transceiver coil 1001, an oscillator 1010, a current sensor 1020, a relay controller 1030, and a safety interlock relay 1040. The equipment safety interlock circuit 90 can be the same as or can be included in interlock circuit 170. For example, the safety interlock circuit 90 or safety interlock relay 1040 can be the same as fall-arrest interlock circuit 330.

The oscillator 1010 is electrically coupled to a voltage source (e.g., Vcc) in the machine 110, such as battery, to produce an oscillating signal to drive the fall-arrest equipment transceiver coil 1001. The fall-arrest equipment transceiver coil 1001 includes one or more loops of wire that produces an oscillating electromagnetic signal when driven by the oscillator 1010. The loop(s) of wire in the fall-arrest equipment transceiver coil 1001 can be disposed on, in, and/or around the fall-arrest clip 162.

The oscillating electromagnetic signal produced by the fall-arrest equipment transceiver coil 1001 can induce an oscillating voltage in the harness coil 900 when the harness coil 900 is within range (e.g., within a predetermined distance) of the fall-arrest equipment transceiver coil 1001. The inductive coupling of the fall-arrest equipment transceiver coil 1001 to the harness coil 900 causes the current through the fall-arrest equipment transceiver coil 1001 to increase compared to the current through the fall-arrest equipment transceiver coil 1001 when the harness coil 900 is out of range (e.g., greater than a predetermined distance) from the fall-arrest equipment transceiver coil 1001. In some embodiments, the oscillator 1010 is a variable or tunable oscillator that can tune the frequency of the oscillating electromagnetic signal that drives the fall-arrest equipment transceiver coil 1001 to match the resonance frequency of the circuit 90 and/or fall-arrest equipment transceiver coil 1001 to optimize power transfer to the harness coil 900.

The current flowing through the fall-arrest equipment transceiver coil 1001 can be monitored by the current sensor 1020, which has an input electrically coupled to the fall-arrest coil and/or to the oscillator 1010. The current sensor 1020 can monitor a time-averaged current through fall-arrest equipment transceiver coil 1001 to mask momentary spikes or drops in current, along with accounting for the periodic change in current due to the signal being AC in nature. Since the range of the fall-arrest equipment transceiver coil 1001 is limited, the increase in current sensed by the current sensor 1020 can indicate that the fall-arrest equipment transceiver coil 1001 is within range of the harness coil 900, and thus that the fall-arrest clip 162 is attached to the attachment ring 152.

The output of the current sensor 1020 is electrically coupled to the relay controller 1030. The relay controller 1030 is configured to generate a safety signal only when the current (e.g., time-averaged current or other current statistic) increases by a predetermined minimum value. The predetermined minimum value can be an absolute number (e.g., an increase of 100 mA) or it can be relative or proportional to the current (e.g., time-averaged current or other current statistic) sensed by the current sensor 1020 when the harness coil 900 is out of range. For example, the predetermined minimum value can be a percentage increase (e.g., 10% to 30%) of the current (e.g., time-averaged current or other current statistic) sensed by the current sensor 1020 when the harness coil 900 is out of range. The relay controller 1030 can be the same as or different than relay controller 620.

The safety interlock relay 1040 has a default open state and a closed state. In the open state, the safety interlock relay 1040 can prevent the machine 110 from receiving power (e.g., from a battery in the machine 110) to operate, which can prevent the controls 140 from functioning. In the closed state, the machine 110 and/or controls 140 can receive power to operate or function. The safety interlock relay 1040 can transition from the default open state to the closed state only in response to the safety signal from the relay controller 1030 which can drive a relay coil 1042 to close a relay switch 1044. The safety interlock relay 1040 can include or can be electrically coupled to other safety interlocks in the safety interlock chain 300 such as the machine ignition key interlock 310 and/or the dead man foot pedal interlock 320. For example, the safety interlock relay 1040 can be the same as fall-arrest interlock circuit 330. In addition, the equipment safety interlock circuit 1000 or the safety interlock relay 1040 can be the same as or different than safety interlock relay 630.

The harness coil 900 includes one or more loops of wire through which an oscillating voltage is induced by the oscillating electromagnetic signal produced by the fall-arrest equipment transceiver coil 1001 when the harness coil 900 is within range (e.g., within a predetermined distance) of the fall-arrest equipment transceiver coil 1001 (or vice versa). When the harness coil 900 is out of range (e.g., greater than a predetermined distance) of the fall-arrest equipment transceiver coil 1001, an oscillating voltage is not induced in the harness coil 900 or the induced voltage is lower than a predetermined value. The loop(s) of wire in the harness coil 900 can be disposed on, in, and/or around the attachment ring 152. The harness coil 900 can be the same as harness coil 414.

The vest control load resistors 910 and respective switches 920 can be used to vary the load resistance across the harness coil 900 and on the induced voltage across the harness coil 900. Each load resistor 910 can have a unique resistance. The vest control resistors are electrically coupled in parallel with each other. When a switch 920 is open, the corresponding load resistor 910 is not coupled to the harness coil 900. When a switch 920 is closed, the corresponding load resistor 910 is coupled to the harness coil 900.

Varying the load resistance on the induced voltage across the harness coil 900 can cause a corresponding change in the current flowing through the fall-arrest equipment transceiver coil 1001 due to reflected impedance, and this current change can be sensed by the current sensor 1020. The switches 920 can be controlled and/or used in any fashion that may be of use to the user. For example, one way may be a simple push button used to alert others in the work environment that the user is in need of assistance. It is important to note that other interlocks in this configuration may still be required to be implemented. For example, the mechanical switches 404 may be combined with this embodiment in series with one of the depicted loads 910. Thus, the load resistors 910 can be used to send commands and/or communicate between the harness interlock circuit 90 and the equipment safety interlock circuit 1000.

Figure 11:
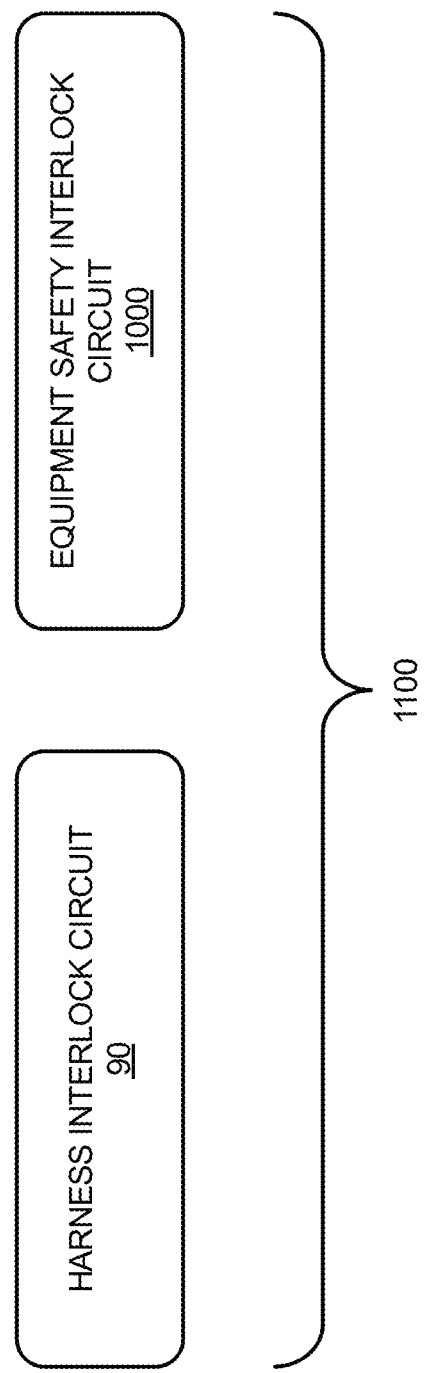
FIG. 11 is a block diagram of a safety interlock system according to an alternative embodiment.

Thus, harness interlock circuit 90 and equipment safety interlock circuit 1000 can function together as a safety interlock system 1100, as illustrated in FIG. 11.

Figure 12:
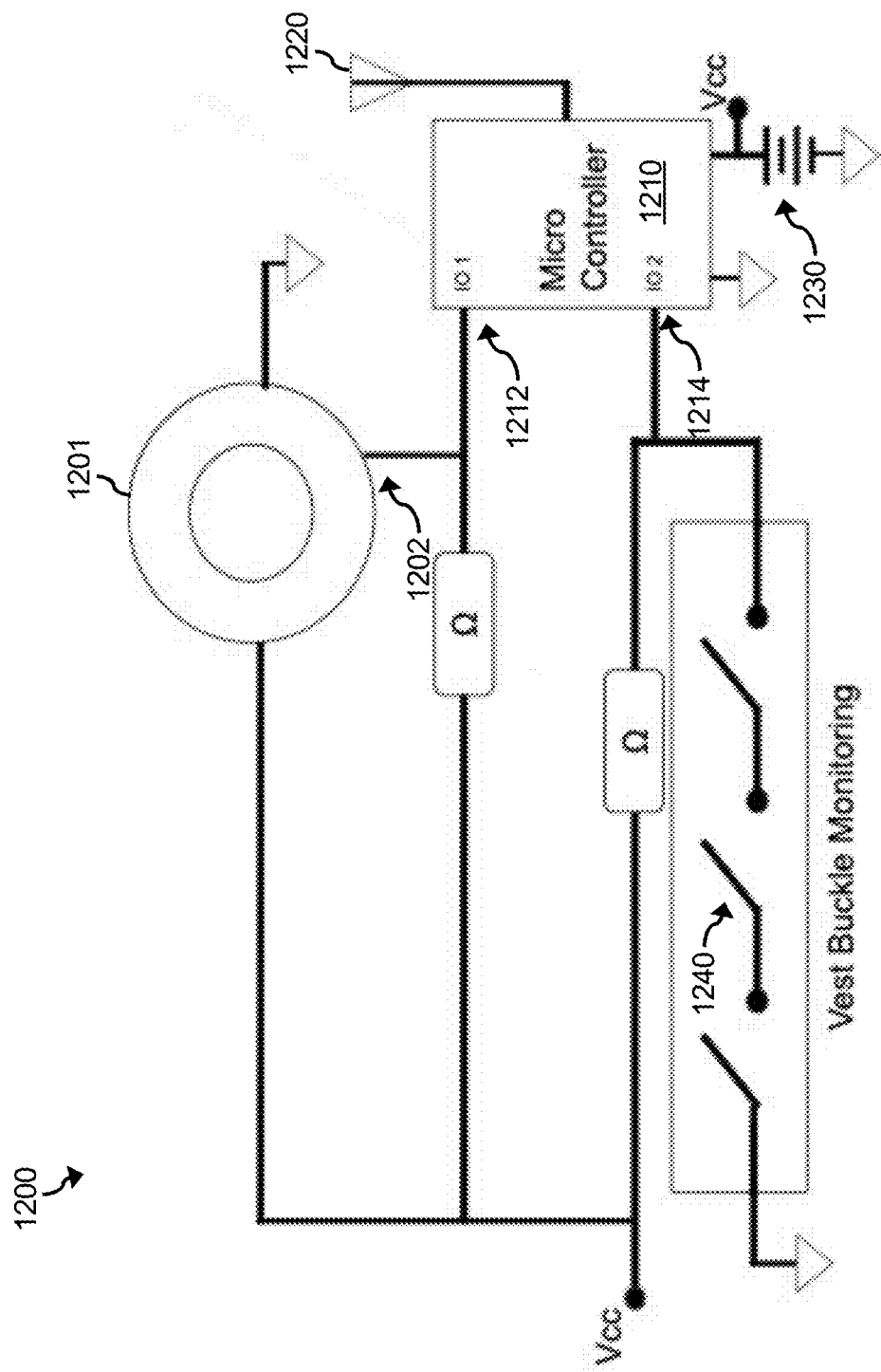
FIG. 12 is a schematic diagram of a harness interlock circuit according to another embodiment.

FIG. 12 is a schematic diagram of a harness interlock circuit 1200, according to another embodiment, that can be incorporated and/or integrated into the safety harness 150. The harness interlock circuit 1200 includes a light-sensor ring 1201, an RF-enabled microcontroller 1210, an antenna 1220, a battery 1230, and optional mechanical switches 1240. The harness interlock circuit 1200 can be the same as or can be included in interlock circuit 180.

Figure 13:
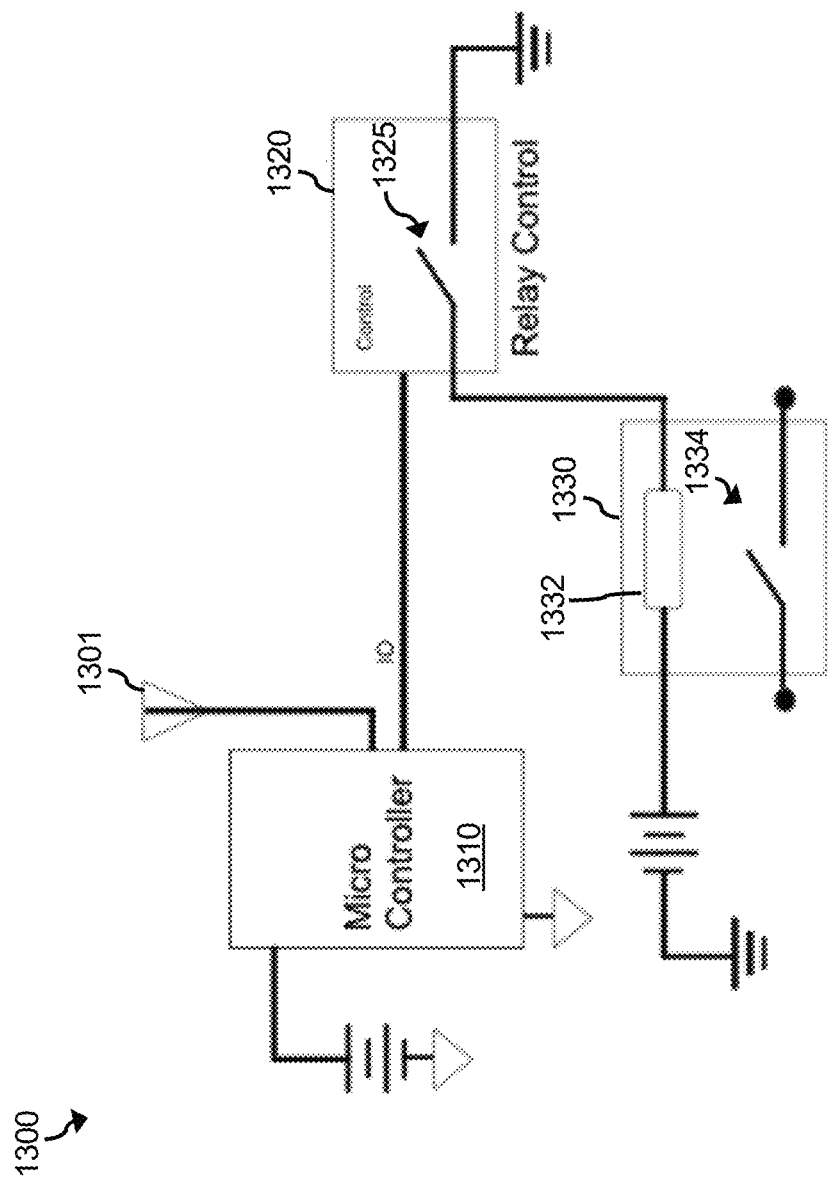
FIG. 13 is a schematic diagram of an equipment safety interlock circuit according to another embodiment.

FIG. 13 is a schematic diagram of an equipment safety interlock circuit 1300, according to another embodiment, that can be incorporated and/or integrated into the machine 110. The equipment safety interlock circuit 1300 includes an antenna 1301, an RF-enabled microcontroller 1310, a relay controller 1320, and a safety interlock relay 1330. The equipment safety interlock circuit 1300 can be the same as or can be included in interlock circuit 170. For example, the safety interlock circuit 1300 can be the same as fall-arrest interlock circuit 330.

Figure 14:
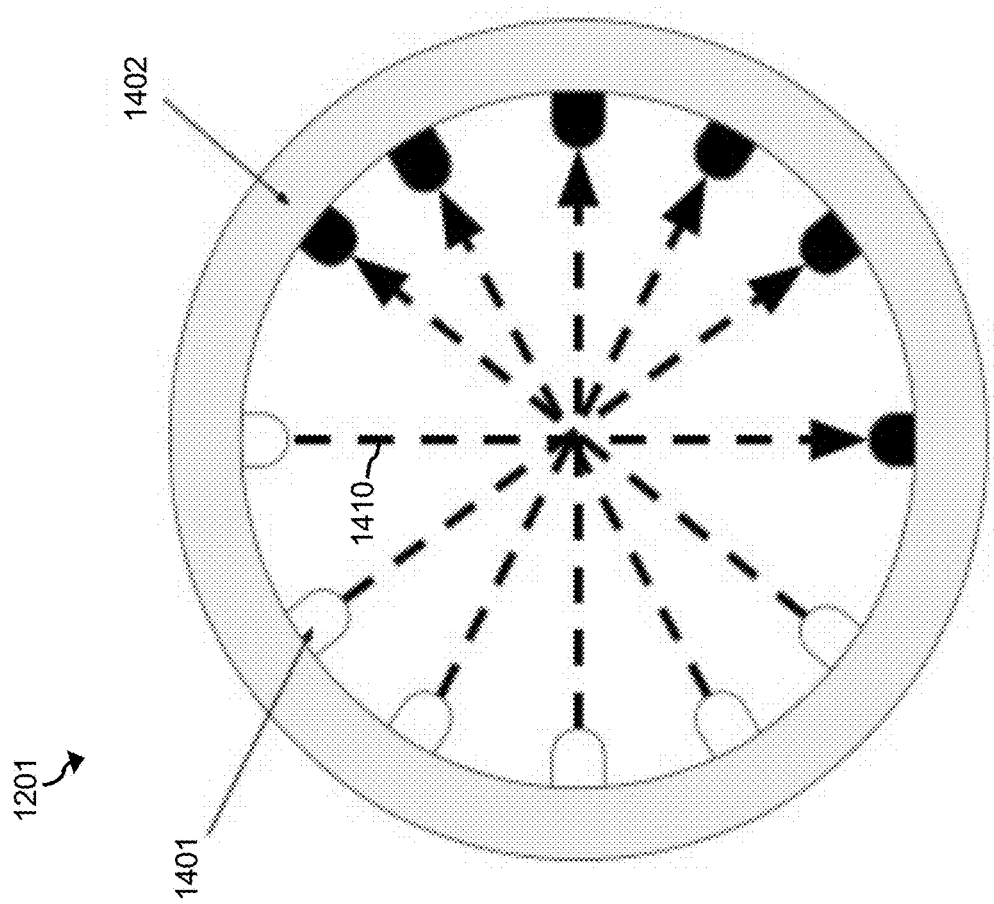
FIG. 14 is a front view of a light-sensor ring, according to an embodiment, in a first state.

The light-sensor ring 1201 includes a plurality of light emitters 1401 and a plurality of light sensors 1402, for example as illustrated in FIG. 14. The light sensors 1402 are configured to receive light 1410 emitted by the light emitters 1401 which may be limited to a predetermined wavelength or wavelength range. For example, the light emitters 1401 can emit infrared light, ultraviolet light, and/or other light. The light emitters 1401 preferably do not emit light in the visible spectrum. The light emitters 1401 can comprise LEDs, lasers, and/or other light sources. Alternatively, the light emitters 1401 can comprise optical fibers that emit light that passes therethrough from an external light source, which can be an LED, laser, and/or another light source. The light emitters 1401 can include optics and/or can produce collimated light that can be directed to only one or a predetermined number of light sensors 1402.

Figure 15:
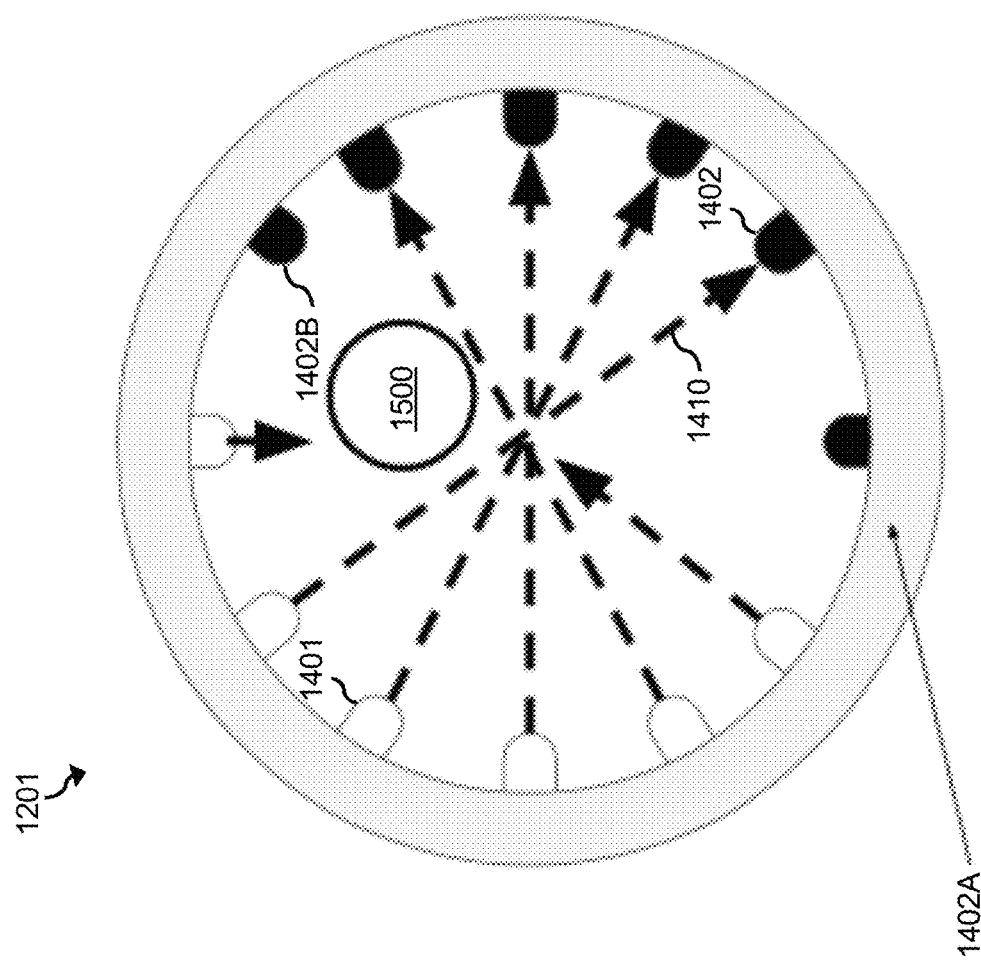
FIG. 15 is the light-sensor ring of FIG. 14 in a second state.

The light-sensor ring 1201 has a first state when each and every light sensor 1402 senses the light 1410 emitted by one or more of the light emitters 1401. The light-sensor ring 1201 is in the first state in FIG. 14. The light-sensor ring 1201 has a second state when at least one light sensor 1402 does not sense the light 1410 or senses less light (e.g., below a predetermined magnitude), emitted by one or more of the light emitters 1401, for example as illustrated in FIG. 15 where an object 1500 blocks light sensors 1402A, 1402B from receiving the light 1410. Object 1500 can be a portion of the fall-arrest clip 162 or an object attached to the fall-arrest clip 162. The light sensors 1402A, 1402B have a higher resistance when the light 1410 is blocked by object 1500 compared to when the light 1410 is not blocked by object 1500.

When the light-sensor ring 1201 is in the first state, the light-sensor ring 1201 produces an output signal having a relatively low voltage. When the light-sensor ring 1201 is in the second state, the light-sensor ring 1201 produces an output signal having a relatively high voltage. The voltage of the output signal from the light-sensor ring 1201 is lower when the light-sensor ring 1201 is in the first state compared to when the light-sensor ring 1201 is in the second state. Conversely, the voltage of the output signal from the light-sensor ring 1201 is higher when the light-sensor ring 1201 is in the second state compared to when the light-sensor ring 1201 is in the first state. The low and high voltage output signals can correspond to a digital on/off signal.

In other embodiments, the light-sensor ring 1201 can have another hollow shape such as a hollow square or cube, a hollow rectangle or rectangular prism, or another hollow body.

Returning to FIG. 12, the microcontroller 1210 has a first input 1212 that is electrically coupled to the output 1202 of the light-sensor ring 1201. The microcontroller 1210 is configured (e.g., with program instructions stored in the memory of the microcontroller and/or with circuitry) to produce a harness status signal to transmit via the antenna 1220 which can be received by antenna 1301. The harness status signal can have a first value when the light-sensor ring 1201 is in the first state and a second value when the light-sensor ring 1201 is in the second state.

The microcontroller 1210 has an optional second input 1214 that is electrically coupled to a plurality of optional mechanical switches 1240, which can be the same as mechanical switches 404. The mechanical switches 1240 are electrically connected in series with each other. Each mechanical switch 1240 can be disposed in a corresponding buckle 155 of the safety harness 150. The mechanical switches 1240 are in the open state when the buckles 155 are disconnected and are in the closed state when the buckles 155 are connected or secured. The mechanical switches 1240 can have a default state as the open state. When one or more of the mechanical switches 1240 is/are in the open state, the second input 1214 has a high voltage. When all of the mechanical switches 1240 are in the closed state, the second input 1214 has a low voltage. The microcontroller 1210 can be configured (e.g., with program instructions stored in the memory of the microcontroller and/or with circuitry) to produce a harness status signal to transmit via the antenna 1220 based on the voltages at the first and second inputs 1212, 1214. For example, the harness status signal can have the first value when the light-sensor ring 1201 is in the first state and all of the mechanical switches 1240 are in the closed state. The harness status signal can have the second value when the light-sensor ring 1201 is in the second state and/or at least one of the mechanical switches 1240 is in the open state. The optional mechanical switches 404 can be omitted from the harness interlock circuit 1200 in some embodiments. Additional inputs to microcontroller 1210 can also be used to transmit other useful information to machine 110, such as an emergency call to get help and/or a battery-charge status.

The light-sensor ring 1201 and the microcontroller 1210 are powered by the battery 1230. The battery 1230 can comprise a 9V battery or another battery, which can be replaced or recharged when depleted. In some embodiments, a voltage sensor can be electrically coupled to the battery 1230 to monitor the charge of the battery 1230. A battery-life indicator, such as a light (e.g., an LED), can be placed on the safety harness 150 to indicate the energy state of the battery 1230. The battery-life indicator can be electrically coupled to the voltage sensor. In some embodiments, a back-up power supply can be available on the machine 110 (e.g., in the bucket 130) in case the battery 1230 becomes depleted while a worker is in the bucket 130 and in an elevated state.

The microcontroller 1310 in the equipment safety interlock circuit 1300 can generate an output signal based on the value of the harness status signal received via the antenna 1301. When the harness status signal has the first value, the output signal of the microcontroller 1310 drives the relay controller 1320. The relay controller 1320 is configured to generate a safety signal in response to the output signal from the microcontroller 1320. For example, the output signal from the microcontroller 1320 can cause a switch 1325 in the relay controller 1320 to transition from a default open state to a closed state to produce the safety signal. In some embodiments, the switch 1325 can drive a relay coil. The relay controller 1320 and switch 1325 can be the same as relay controller 620 and switch 625, respectively.

The safety interlock relay 1330 has a default open state and a closed state. In the open state, the safety interlock relay 1330 can prevent the machine 110 from receiving power (e.g., from a battery in the machine 110) to operate, which can prevent the controls 140 from functioning. In the closed state, the machine 110 and/or controls 140 can receive power to operate or function. The safety interlock relay 1330 can transition from the default open state to the closed state only in response to the safety signal from the relay controller 1320 which can drive a relay coil 1332 to close a relay switch 1334. The safety interlock relay 1330 can include or can be electrically coupled to other safety interlocks in the safety interlock chain 300 such as the machine ignition key interlock 310 and/or the dead man foot pedal interlock 320. For example, the equipment safety interlock circuit 1300 or the safety interlock relay 1330 can be the same as fall-arrest interlock circuit 330. In addition, the safety interlock relay 1330 can be the same as safety interlock relay 630, 1040.

Figure 16:
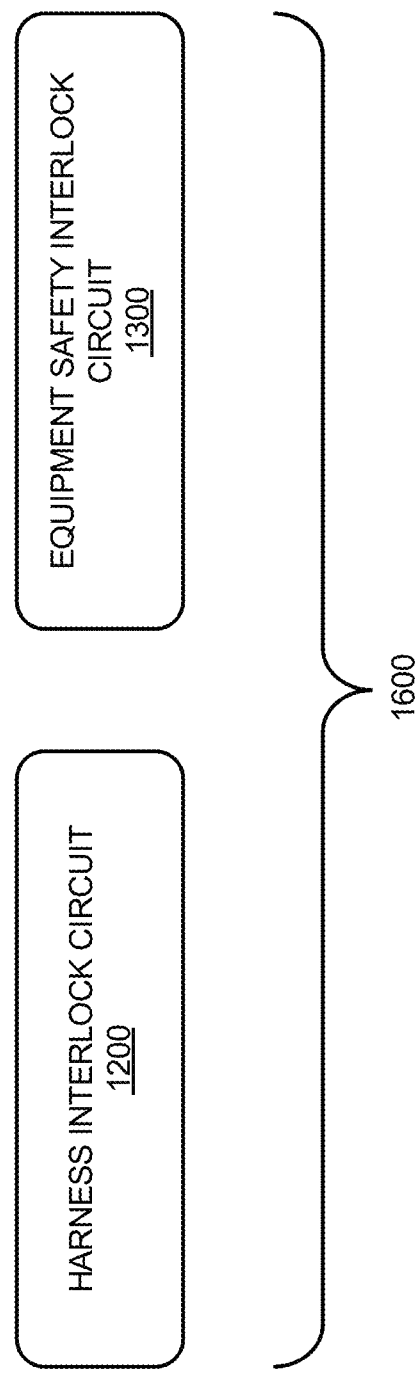
FIG. 16 is a block diagram of a safety interlock system according to another embodiment.

Thus, harness interlock circuit 1200 and equipment safety interlock circuit 1300 can function together as a safety interlock system 1600, as illustrated in FIG. 16.

Figure 17:
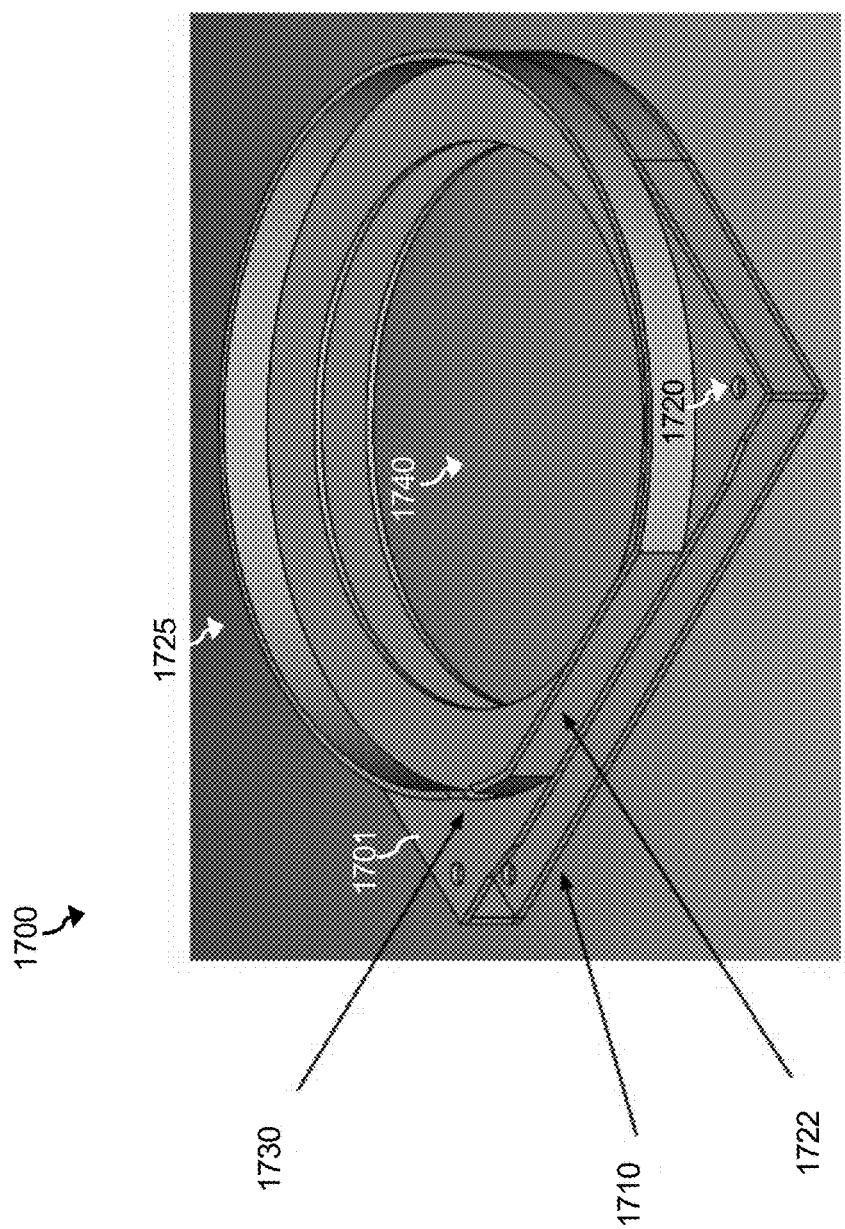
FIG. 17 is a perspective view of a harness coil frame according to an embodiment.

FIG. 17 is a perspective view of a harness coil frame 1700 according to an embodiment. The harness coil frame 1700 comprises a base 1701 in which a slot 1710 is defined. The slot 1710 is configured to match or conform to the profile of the attachment ring 152 such that the attachment ring 152 can slide into and out of the slot 1710. Mounting holes 1720 are defined on the housing 1701 near the opening of the slot 1710. The mounting holes 1720 can receive a threaded fastener (e.g., a screw or bolt) to secure the attachment ring 152 in the slot 1710.

A spool housing 1725 is attached to the base 1701. The spool housing 1725 defines a shape and volume to receive a coil insert 1800 (FIG. 18), such as through an interference or friction fit. For example, the spool housing 1725 can be round or circular with a planar portion 1722 to align the spool housing 1725 with the coil insert 1800. The spool housing 1725 has a hollow central region 1740 that can conform to the hollow region of the attachment ring 152. In some embodiments, the coil insert 1800 can be attached to the spool housing 1725 with an adhesive. A channel or notch 1730 can be defined in the spool housing 1725 to allow one or more wires to electrically couple a coil in the coil insert 1800 (e.g., wire 1820) to other portions of the harness interlock circuit.

Figure 18:
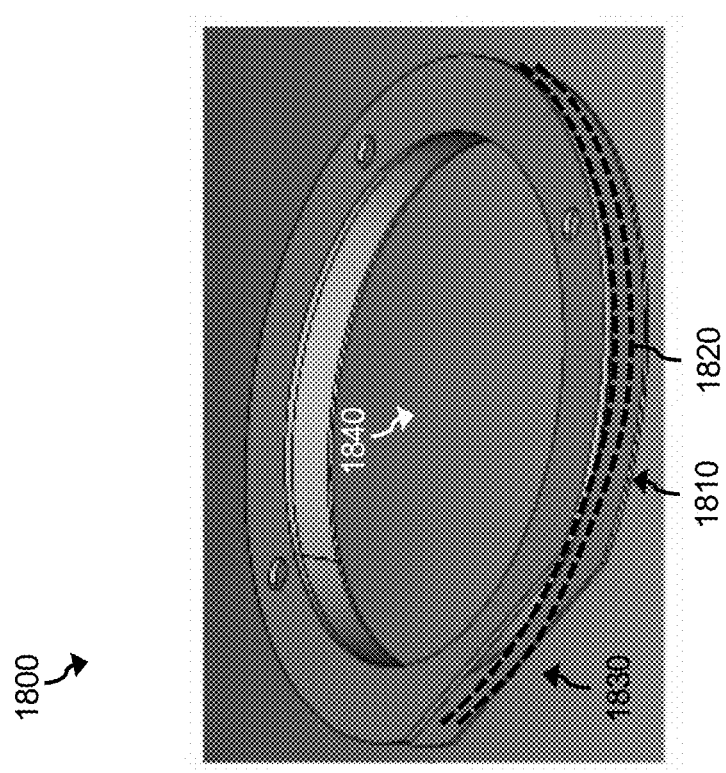
FIG. 18 is a perspective view of a coil insert according to an embodiment.

FIG. 18 is a perspective view of a coil insert 1800 according to an embodiment. The coil insert 1800 defines a coil channel 1810 on the perimeter of the coil insert 1800 along which a wire 1820 can be wrapped to form the harness coil (e.g., harness coil 414, 900). The coil insert 1800 and spool housing 1725 have complementary shapes such that they can mate together. For example the coil insert 1800 can be round or circular with a planar portion 1830 to align the spool housing coil insert 1800 with the spool housing 1725 (e.g., to align with corresponding planar portion 1722). In addition, coil insert 1800 has a hollow central region 1840 that can conform to the hollow region of the attachment ring 152 and hollow central region 1740.

Figure 19:
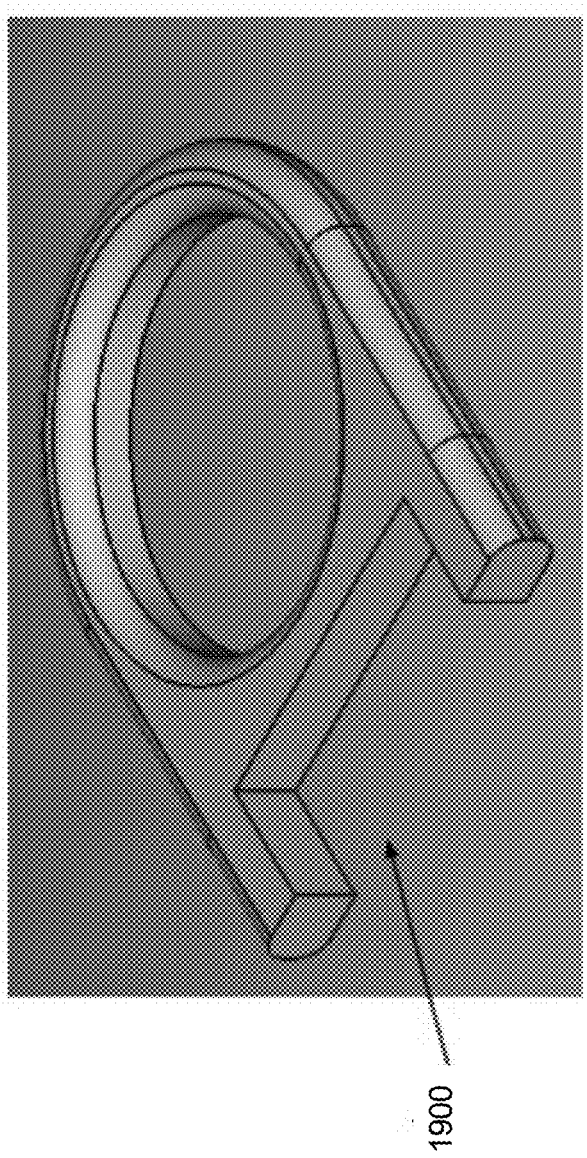
FIG. 19 is a perspective view of an example safety attachment ring.

FIG. 19 is a perspective view of an example attachment ring 1900, which can be the same as attachment ring 152. The attachment ring 1900 is configured to be attached to a safety harness, such as safety harness 150. The harness coil frame 1700 and the coil insert 1800 are configured and arranged to be mounted on the attachment ring 1900 and/or attachment ring 152.

Figure 20:
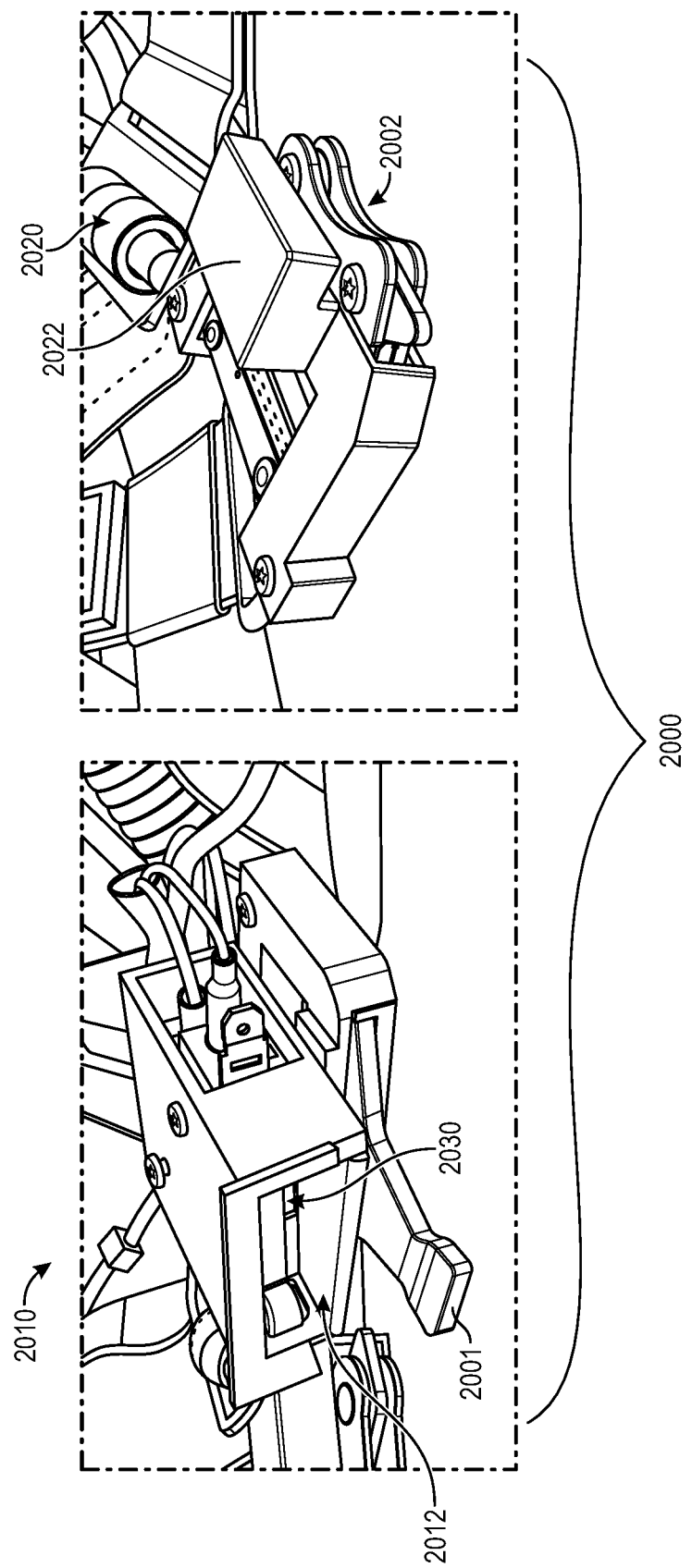
FIG. 20 is a perspective view of a buckle switch assembly, in a disengaged state.

FIG. 20 is a perspective view of a buckle switch assembly 2000, in a disengaged state, that includes a mechanical switch. The buckle switch assembly 2000 includes a limit-switch assembly 2010 mounted on a male buckle portion 2001 and a plug assembly 2020 mounted on a female buckle portion 2002. The plug assembly 2020 includes a protrusion block 2022 that is configured to mate with a hollow region 2012 define in the limit-switch assembly 2010 when the male and female buckle portions 2001, 2002 are engaged. A limit switch 2030 is disposed in the hollow region 2012. When the protrusion block 2022 is inserted into the hollow region 2012, the protrusion block 2022 presses on the limit switch 2030 to change the state of the switch. Thus, the limit switch 2030 has a default first or open state, such as when the protrusion block 2022 is not inserted into the hollow region 2012 to press on the limit switch 2030, and a second state when the protrusion block 2022 presses on the limit switch 2030. The first and second states of the limit switch 2030 are configured to correspond to the disengaged and engaged states, respectively, of the male and female buckle portions 2001, 2002.

The limit switch 2030 can be replaced with another switch, an optical sensor, a magnetic sensor (e.g., a Hall effect sensor), or another sensor or switch. The limit switch 2030 can be the same as mechanical switch 155, 404, 1240.

Figure 21:
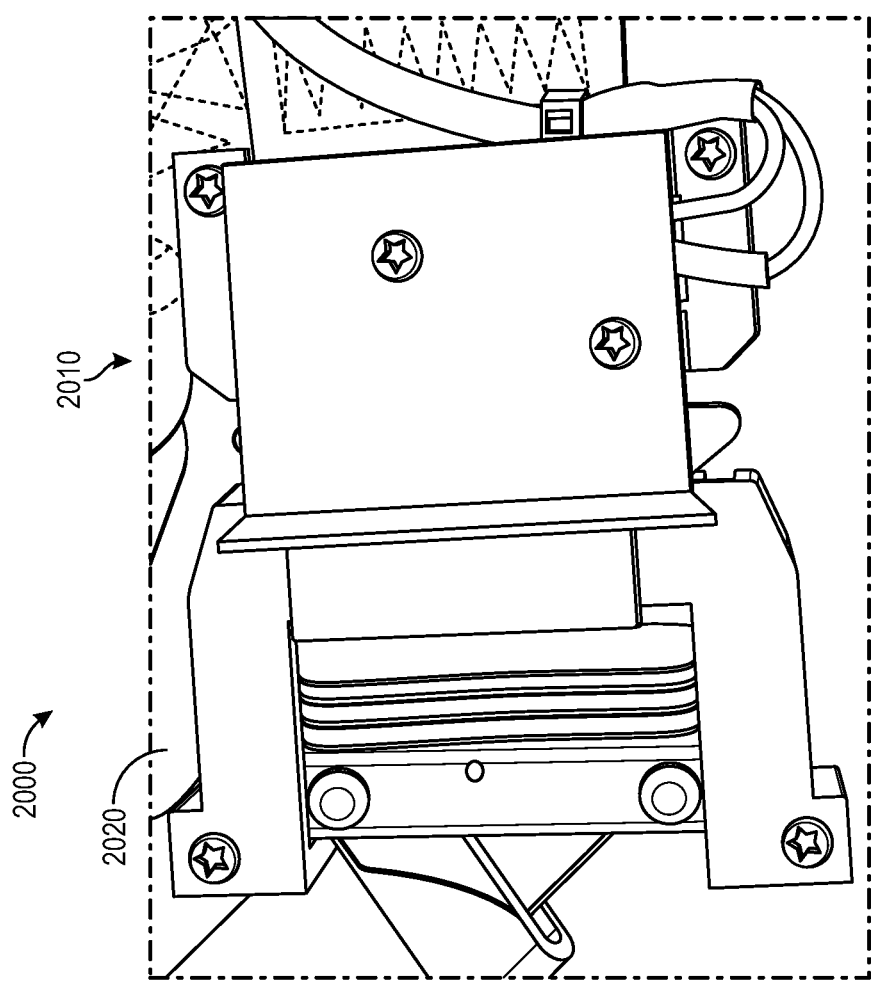
FIG. 21 is a top view of the buckle switch assembly of FIG. 20 in an engaged state.

FIG. 21 is a top view of the buckle switch assembly 2000 in an engaged state.

The invention should not be considered limited to the particular embodiments described above. Various modifications, equivalent processes, as well as numerous structures to which the invention may be applicable, will be readily apparent to those skilled in the art to which the invention is directed upon review of this disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an application or app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of this application need not reside on a single computer or processor, but may be distributed in a modular fashion among a number of different computers or processors to implement various aspects of this application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the disclosure and claims include new and novel improvements to existing methods and technologies, which were not previously known nor implemented to achieve the useful results described above. Users of the method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The invention claimed is:

1. A safety interlock system comprising:
 a safety harness comprising:
  a plurality of buckles to secure the harness to a user; and
  a safety attachment ring;
 a harness interlock circuit comprising a harness coil attached to the safety attachment ring;
 a fall-arrest belt clip configured to be releasably attached to the safety attachment ring, the fall-arrest belt clip attached to a fall-arrest tether; and
 an equipment safety interlock circuit comprising:
  a fall-arrest transceiver coil disposed on or in the fall-arrest belt clip;
  a relay controller configured to generate a safety signal when an increase in a current flowing through the fall-arrest coil is greater than a minimum value; and
  a safety interlock relay having a default open state and a closed state, the safety interlock relay configured to transition from the default open state to the closed state only in response to the safety signal,
 wherein:
  when a load is present across the harness coil, the current flowing through the fall-arrest coil when the fall-arrest belt clip is attached to the safety attachment ring is greater than the current flowing through the fall-arrest coil when the fall-arrest belt clip is detached from the safety attachment ring, and
  a difference between (a) the current flowing through the fall-arrest coil when the fall-arrest belt clip is attached to the safety attachment ring and (b) the current flowing through the fall-arrest coil when the fall-arrest belt clip is detached from the safety attachment ring is greater than the minimum value.

2. The system of claim 1, wherein the harness interlock circuit further comprises:
 a battery; and
 an oscillator electrically coupled to the battery, the oscillator configured to produce an oscillator signal that drives the harness coil.

3. The system of claim 2, further comprising a power circuit electrically coupled to the oscillator, the power circuit comprising the battery and a plurality of mechanical switches electrically coupled in series with each other, each mechanical switch disposed in a respective buckle and having an open state when the respective buckle is disconnected and a closed state when the respective buckle is connected.

4. The system of claim 3, wherein the battery provides power to the oscillator only when all of the mechanical switches are in the closed state.

5. The system of claim 2, wherein the equipment safety interlock circuit further comprises a current sensor having an input electrically coupled to the fall-arrest coil and an output electrically coupled to the relay controller.

6. The system of claim 2, wherein the equipment safety interlock circuit further comprises an amplifier having an input electrically coupled to the fall-arrest coil and an output electrically coupled to the relay controller.

7. The system of claim 6, wherein the amplifier includes:
 a pre-comparator having an input electrically coupled to the fall-arrest coil;
 a filter having an input electrically coupled to an output of the pre-comparator; and
 a post-comparator having an input electrically coupled to the output of the filter and an output electrically coupled to the relay controller.

8. The system of claim 6, wherein:
 the amplifier is configured to convert the current flowing through the fall-arrest coil into an ON signal when the increase in the current flowing through the fall-arrest coil is greater than the minimum value, and
 the relay controller is configured to generate the safety signal in response to the ON signal.

9. The system of claim 8, wherein the relay controller comprises a switch having a default open state and a closed state, the relay controller configured to transition the switch to the closed state only in response to the ON signal.

10. The system of claim 2, further comprising a back-up power supply power source to power the harness interlock circuit when the battery is depleted.

11. The system of claim 1, wherein the buckles are configured to secure the harness to the legs and the chest of the user.

12. The system of claim 1, further comprising a fall-arrest vest that comprises the safety harness.

13. The system of claim 1, wherein the equipment safety interlock circuit further comprises a tunable oscillator configured to produce an oscillator signal that drives the fall-arrest coil.

14. The system of claim 13, wherein the tunable oscillator is configured to drive the fall-arrest coil at a resonance frequency of the coupled harness interlock circuit.

15. The system of claim 14, wherein the equipment safety interlock circuit further comprises a current sensor having an input electrically coupled to the fall-arrest coil and an output electrically coupled to the relay controller.

16. The system of claim 14, wherein the harness interlock circuit further comprises a plurality of vest control load resistors that are electrically coupled in parallel with each other and that are electrically coupled to the harness coil.

17. The system of claim 16, wherein the harness interlock circuit further comprises a plurality of switches, each switch electrically coupled to a respective vest control load resistor to independently vary a load across the harness coil to alter a reflected impedance from and the current flowing through the fall-arrest coil.

18. The system of claim 16, further comprising a harness coil frame having a slot to receive the safety attachment ring, the harness coil attached to the harness coil frame.

19. The system of claim 18, wherein the harness coil is wrapped around a coil insert and the harness coil frame includes a spool housing configured to receive the coil insert.

20. A safety interlock system comprising:
 a safety harness comprising:
  a plurality of buckles to secure the harness to a user; and
  a safety attachment ring;

a harness interlock circuit disposed on or in the vest, the harness circuit comprising:
  a light-sensor ring comprising a plurality of light emitters and a plurality of light sensors, the light sensors configured to receive light emitted by the light emitters;
  a harness controller electrically coupled to an output of the light-sensor ring; and
  a harness antenna electrically coupled to the harness controller;
a fall-arrest belt clip configured to be releasably attached to the safety attachment ring, the fall-arrest belt clip attached to a fall-arrest tether; and
an equipment safety interlock circuit comprising:
  an equipment controller;
  an equipment safety antenna electrically coupled to the equipment controller;
  a relay controller electrically coupled to an output of the equipment controller, the relay controller configured to generate a safety signal in response to an output signal from the equipment controller; and
  a safety interlock relay having a default open state and a closed state, the safety interlock relay configured to transition from the default open state to the closed state only in response to the output signal,
wherein:
  when the fall-arrest belt clip is detached from the safety attachment ring, each light sensor receives the light emitted by at least one of the light emitters to place the light-sensor ring in a first state,
  when the fall-arrest belt clip is attached to the safety attachment ring, the fall-arrest belt clip blocks at least one of the light sensors from receiving the light from the at least one of the light emitters to place the light-sensor ring in a second state,
  the harness controller is configured to broadcast a second state signal, via the harness antenna, when the light-sensor ring is in the second state, and
  the equipment controller is configured to produce the output signal only in response to receiving the second state signal via the equipment safety antenna.

21. The safety interlock system of claim 20, wherein the harness controller is configured to broadcast a first state signal, via the harness antenna, when the light-sensor ring is in the first state.

22. The safety interlock system of claim 20, wherein the light emitters are configured to emit infrared light.

23. The safety interlock system of claim 20, wherein the harness interlock circuit further comprises a battery that is electrically coupled to the light-sensor ring and the harness controller.

24. The safety interlock system of claim 20, wherein:
  the harness interlock circuit further comprises a plurality of mechanical switches electrically coupled in series with each other, each mechanical switch disposed in a respective buckle and having an open state when the respective buckle is disconnected and a closed state when the respective buckle is connected, and
  the mechanical switches are electrically coupled to the harness controller.

25. The safety interlock system of claim 24, wherein the harness controller is configured to broadcast the second state signal, via the harness antenna, when the light-sensor ring is in the second state and all of the mechanical switches are in the closed state.

26. The safety interlock system of claim 24, wherein the harness controller is configured to broadcast a first state signal, via the harness antenna, when the light-sensor ring is in the first state and/or at least one of the mechanical switches is in the open state.

* * * * *